US012652871B2

(12) United States Patent
Cellek et al.

(10) Patent No.: US 12,652,871 B2
(45) Date of Patent: Jun. 9, 2026

(54) STACKED MULTI-SPECTRAL IMAGE SENSOR

(71) Applicant: Apple Inc., Cupertino, CA (US)

(72) Inventors: Oray O. Cellek, Los Altos, CA (US); Fei Tan, San Jose, CA (US); Gershon Rosenblum, Fremont, CA (US); Hong Wei Lee, San Jose, CA (US); Cheng-Ying Tsai, San Jose, CA (US); Jae Y. Park, San Jose, CA (US); Christophe Verove, Le Cheylas (FR); John L Orlowski, Santa Clara, CA (US); Siddharth Joshi, Grenoble (FR); Xiangli Li, Palo Alto, CA (US); David Coulon, Aix-en-Provence (FR); Xiaofeng Fan, San Jose, CA (US); Keith Lyon, San Jose, CA (US); Nicolas Hotellier, Jarrie (FR); Arnaud Laflaquière, Paris (FR)

(73) Assignee: Apple Inc., Cupertino, CA (US)

( * ) Notice: Subject to any disclaimer, the term of this patent is extended or adjusted under 35 U.S.C. 154(b) by 760 days.

(21) Appl. No.: 17/903,067

(22) Filed: Sep. 6, 2022

(65) Prior Publication Data

US 2024/0079440 A1 Mar. 7, 2024

(51) Int. Cl.
H01L 27/146 (2006.01)
H04N 25/75 (2023.01)
(Continued)

(52) U.S. Cl.
CPC ......... H10F 39/1847 (2025.01); H04N 25/75 (2023.01); H10F 39/1843 (2025.01); H10F 39/8053 (2025.01); H10F 39/811 (2025.01)

(58) Field of Classification Search
CPC ............. H10F 39/1847; H10F 39/1843; H10F 39/8053; H10F 39/811; H10F 39/809;
(Continued)

(56) References Cited

U.S. PATENT DOCUMENTS

| | | | | |
|---|---|---|---|---|
| 6,346,431 B1 * | 2/2002 | Yoo | ...................... | H10F 77/146 |
| | | | | 257/E31.093 |
| 2009/0289247 A1 * | 11/2009 | Meng | ..................... | H10K 30/30 |
| | | | | 257/E51.027 |

(Continued)

FOREIGN PATENT DOCUMENTS

WO 2020264272 A1 12/2020

*Primary Examiner* — Ermias T Woldegeorgis
(74) *Attorney, Agent, or Firm* — Meitar Patents Ltd.; Daniel Kligler

(57) ABSTRACT

A multispectral sensing device includes a first die, including silicon, which is patterned to define a first array of sensor elements, which output first electrical signals in response to optical radiation that is incident on the device in a band of wavelengths less than 1000 nm that is incident on the front side of the first die. A second die has its first side bonded to the back side of the first die and includes a photosensitive material and is patterned to define a second array of sensor elements, which output second electrical signals in response to the optical radiation that is incident on the device in a second band of wavelengths greater than 1000 nm that passes through the first die and is incident on the first side of the second die. Readout circuitry reads the first electrical signals and the second electrical signals serially out of the device.

16 Claims, 8 Drawing Sheets

(51) Int. Cl.
    *H10F 39/00*        (2025.01)
    *H10F 39/18*        (2025.01)

(58) Field of Classification Search
    CPC ......... H10F 30/10; H10F 30/21; H04N 25/75;
                            H01L 25/043
    See application file for complete search history.

(56)                 References Cited

U.S. PATENT DOCUMENTS

| | | | |
|---|---|---|---|
| 2010/0171097 A1* | 7/2010 | Nagai | H10F 39/011 |
| | | | 257/E31.032 |
| 2015/0331279 A1* | 11/2015 | Kimura | G03F 7/0007 |
| | | | 430/7 |
| 2017/0278826 A1* | 9/2017 | Sugizaki | G02B 5/204 |
| 2018/0151619 A1* | 5/2018 | Yamashita | H10F 39/014 |
| 2020/0105815 A1* | 4/2020 | Huang | H10F 39/8053 |
| 2020/0412908 A1 | 12/2020 | Kobayashi | |
| 2020/0412980 A1 | 12/2020 | Agranov et al. | |
| 2022/0019010 A1* | 1/2022 | Tschekalinskij | G02B 5/3025 |

* cited by examiner

Transmittance

Wavelength

STACKED MULTI-SPECTRAL IMAGE SENSOR

FIELD OF THE INVENTION

The present invention relates generally to optoelectronic devices, and particularly to image sensors and methods for their fabrication.

BACKGROUND

In some imaging applications, multiple image sensors acquire images of the same scene in different spectral ranges. For example, a red/green/blue (RGB) image sensor may capture an image of the scene under visible light while an infrared (IR) image sensor captures an image of a pattern of IR structured light that is projected onto the same scene. The IR image is processed to produce a depth map of the scene, which is registered with the RGB image to create a three-dimensional (3D) color image of the scene.

U.S. Patent Application Publication 2020/0412908, whose disclosure is incorporated herein by reference, describes stacked electromagnetic radiation sensors for visible image sensing and infrared depth sensing, or for visible image sensing and infrared image sensing. This publication describes a sensor stack including first and second electromagnetic radiation sensors. The first electromagnetic radiation sensor has a high quantum efficiency for converting a first range of electromagnetic radiation wavelengths into a first set of electrical signals. The second electromagnetic radiation sensor is positioned in a field of view of the first electromagnetic radiation sensor and has a high quantum efficiency for converting a second range of electromagnetic radiation wavelengths into a second set of electrical signals and a low quantum efficiency for converting the first range of electromagnetic radiation wavelengths into the second set of electrical signals. The first range of wavelengths does not overlap the second range of wavelengths, and the second electromagnetic radiation sensor is at least partially transmissive to the first range of electromagnetic radiation wavelengths.

Documents incorporated by reference in the present patent application are to be considered an integral part of the application except that, to the extent that any terms are defined in these incorporated documents in a manner that conflicts with definitions made explicitly or implicitly in the present specification, only the definitions in the present specification should be considered.

The terms "optical radiation" and "light" are used interchangeably in the context of the present description and in the claims to refer to electromagnetic radiation in any or all of the visible, infrared, and ultraviolet spectral ranges.

SUMMARY

Embodiments of the present invention that are described hereinbelow provide devices and methods for multispectral imaging.

There is therefore provided, in accordance with an embodiment of the invention, a multispectral sensing device, including a first die, which has a front side and a back side and includes silicon, which is patterned to define a first array of first sensor elements configured to output first electrical signals in response to optical radiation that is incident on the device in a first band of wavelengths less than 1000 nm that is incident on the front side of the first die. A second die has a first side bonded to the back side of the first die and includes a photosensitive material, and is patterned to define a second array of second sensor elements configured to output second electrical signals in response to the optical radiation that is incident on the device in a second band of wavelengths greater than 1000 nm that passes through the first die and is incident on the first side of the second die. Readout circuitry is coupled to read the first electrical signals and the second electrical signals serially out of the device.

In a disclosed embodiment, the first die is patterned with an array of color filters.

In some embodiments, the photosensitive material in the second die includes a semiconductor material. In one embodiment, the semiconductor material includes InGaAsN. In another embodiment, the semiconductor material includes SiGeC.

Alternatively, the photosensitive material in the second die may include a quantum film, or the second sensor elements in the second die may include organic photodiodes.

In some embodiments, the device includes a third die, which is bonded to a second side of the second die, opposite the first side, and which includes at least a part of the readout circuitry. In some of these embodiments, the device includes conductive vias extending through the second die so as to connect the first sensor elements to the readout circuitry in the third die. In a disclosed embodiment, the conductive vias extend through the second die around respective peripheries of the second sensor elements.

In some embodiments, the first array has a first pitch, and the second array has a second pitch, which is greater than the first pitch.

Additionally or alternatively, the first array extends over a first area of the first die, and the second array extends over a second area of the second die, which is smaller than the first area.

In one embodiment, the first and second dies are curved with a common direction of curvature.

In some embodiments, the device includes a first optical filter disposed over the front side of the first die and configured to pass both the first and second bands of wavelengths, and a second optical filter disposed between the first and second dies and configured to pass the second band of wavelengths.

In one embodiment, the first optical filter has a first passband in the first band of wavelengths and a second passband in the second band of wavelengths, and the second optical filter includes an optical long-pass filter having a cut-on wavelength between the first and second bands.

Additionally or alternatively, the second optical filter includes an arrangement of waveguides, which are aligned with the second sensor elements.

Further additionally or alternatively, the device includes multiple metal layers disposed on the back side of the first die, including at least a first metal layer that is patterned to connect the first sensor elements to the readout circuitry and a second metal layer that is configured to serve as a part of the second optical filter. In one embodiment, the second metal layer is patterned to define a diffraction grating.

There is also provided, in accordance with an embodiment of the invention, a method for producing a sensing device, which includes patterning a first die, which has a front side and a back side and includes silicon, to define a first array of first sensor elements configured to output first electrical signals in response to optical radiation that is incident on the device in a first band of wavelengths less than 1000 nm that is incident on the front side of the first die. A first side of a second die, which includes a photosensitive material, is bonded to the back side of the first die. The second die is patterned to define a second array of second sensor elements configured to output second electrical signals in response to the optical radiation that is incident on the device in a second band of wavelengths greater than 1000 nm that passes through the first die and is incident on the first side of the second die. Readout circuitry is coupled to read the first electrical signals and the second electrical signals serially out of the device.

The present invention will be more fully understood from the following detailed description of the embodiments thereof, taken together with the drawings in which:

DETAILED DESCRIPTION OF EMBODIMENTS

Figure 1A:
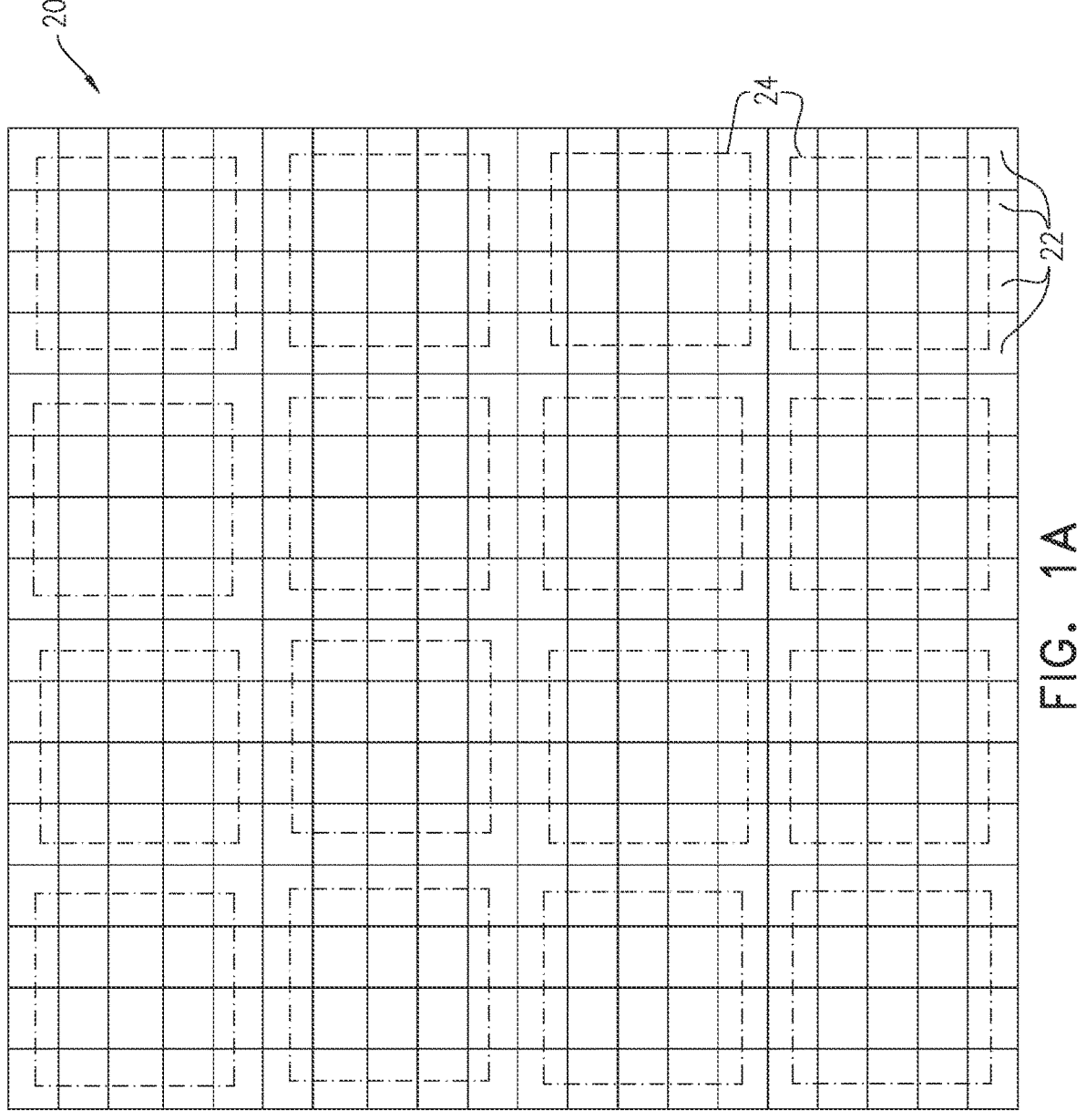
FIG. 1A is a schematic frontal view of a multispectral image sensor, in accordance with an embodiment of the invention.

For image sensing applications in the visible and near IR spectral ranges, up to about 1000 nm, silicon sensor arrays are generally the technology of choice. Silicon image sensor dies with high resolution (i.e., fine pitch) and high sensitivity are inexpensive and widely available. At longer wavelengths, however, silicon is ineffective as a photosensor. In fact, beyond about 1100 nm, thin wafers of silicon are essentially transparent.

Embodiments of the present invention that are described herein take advantage of this property of silicon in providing stacked multispectral sensing devices. In these embodiments, a silicon die is patterned to define a first array of sensor elements, which output electrical signals in response to incident optical radiation in a wavelength band less than 1000 nm. A second die, comprising a photosensitive material with an IR absorption band, is bonded to the back side of the silicon die, for example by direct bonding, and is patterned to define a second array of sensor elements. (In the present description and in the claims, the "front side" of the silicon die is the side through which the optical radiation will be received in operation of the sensing device, and the "back side" is the opposite side.) These latter sensor elements output electrical signals in response to optical radiation in a band of wavelengths greater than 1000 nm. Optical radiation in this band that is incident on the device passes through the silicon die and is thus incident on the second die.

Readout circuitry reads out the electrical signals from both the silicon die and the second die, and thus provides image data for both spectral bands simultaneously. Because the sensor dies are stacked, the two arrays of sensor elements share the same optical aperture, and the images they produce are perfectly registered with one another. Close stacking of the sensor dies also enhances the quality of the image data produced by the second die and enables the design and manufacture of sensing devices that are compact in both the axial and transverse dimensions. Such devices can be used, for example, in 3D color imaging cameras, in which the silicon sensor array is patterned with color filters to capture a color image of a scene, while the second sensor array captures an image of IR patterned light that is projected onto the scene.

The second die may comprise various sorts of IR-sensitive materials. In some embodiments, for example, the second die comprises a semiconductor material, such as a II-VI or III-V compound, which is selected for its sensitivity in the desired wavelength band. In other embodiments, the second die comprises organic photodiodes or a quantum film, i.e., a colloidal film comprising quantum dots engineered for sensitivity in the desired wavelength band.

In some embodiments, a third die containing readout circuits is bonded to the side of the second die opposite the silicon die. The third die is coupled to read out at least the electrical signals output by the array of sensor elements on the second die. This third die may also contain readout circuits for reading out the electrical signals from the silicon die. For this purpose, the sensor elements in the silicon dies may be connected to the readout circuits by conductive vias extending through the second die. Alternatively, the silicon die and the second die may have respective readout circuits on different dies.

Figure 1B:
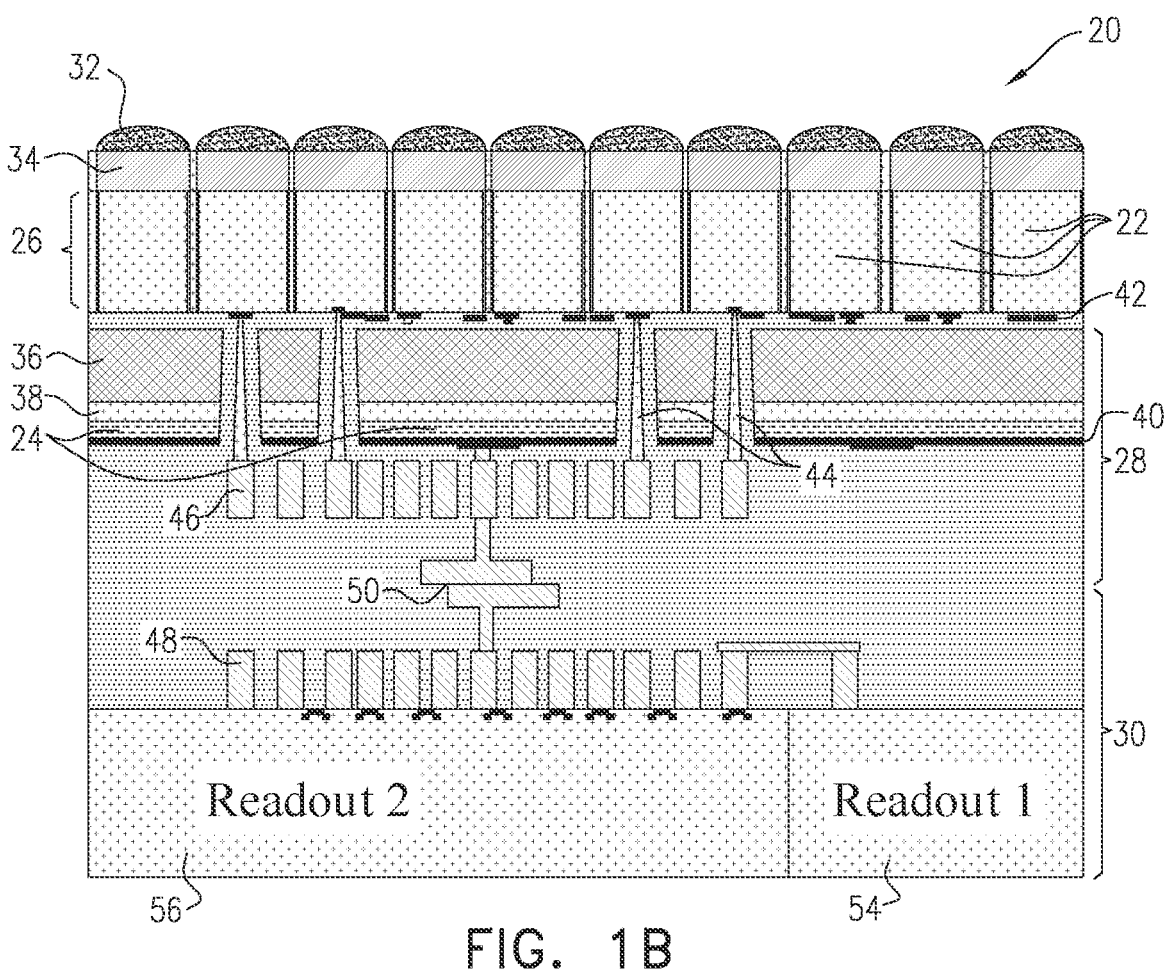
FIG. 1B is a schematic sectional view of the multispectral image sensor of FIG. 1A, in accordance with an embodiment of the invention.
Figure 1C:
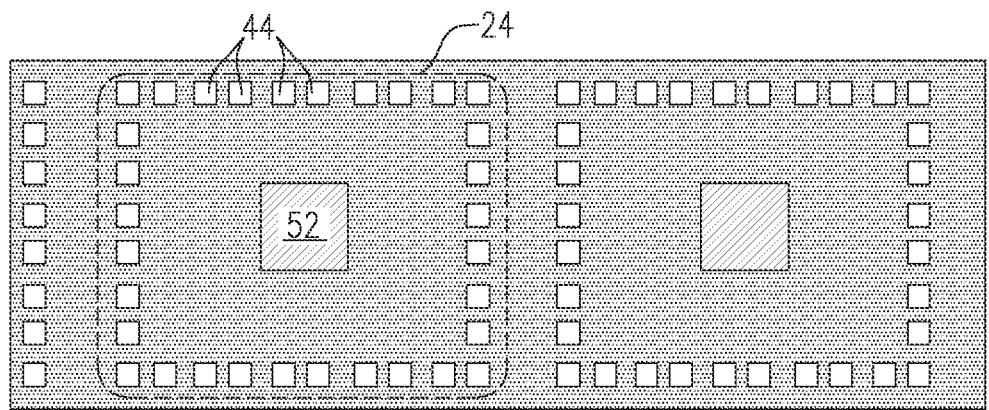
FIG. 1C is a schematic detail view of electrical connections in a multispectral image sensor, in accordance with an embodiment of the invention.

Reference is now made to FIGS. 1A, 1B and 1C, which schematically illustrate a multispectral image sensor 20, in accordance with an embodiment of the invention. FIG. 1A is a frontal view, FIG. 1B is a sectional view, and FIG. 1C is a detail view of electrical connections in the image sensor. For the sake of simplicity and clarity of illustration, these figures show only small parts of the entire image sensor and are not drawn to scale.

Image sensor 20 is typically manufactured by stacking multiple patterned wafers, which are then diced to produce many image sensors of this type. (This process is described hereinbelow with reference to FIGS. 7A-E.) In other words, each image sensor die actually comprises a stack of two or more subsidiary dies, derived from the stack of wafers, with intermediate metal and dielectric layers between the subsidiary dies. In the present description and in the claims, the term "die" refers to these subsidiary dies within the stack that makes up the complete image sensor die.

Thus, image sensor 20 comprises a silicon die 26, which is patterned to define an array of sensor elements 22. (Arrays of sensor elements are also referred to herein as "pixel arrays.") Sensor elements 22 output electrical signals in response to optical radiation that is incident on the front side of silicon die 26 in a band of wavelengths less than 1000 nm. Sensor elements 22 may be produced, for example, using a complementary metal-oxide semiconductor (CMOS) process, with a pixel transistor 42 integrated with each sensor element. Each sensor element 22 in the pictured embodiment is overlaid by a color filter 34, for example a red, green, or blue filter in a mosaic array. Alternatively, color filters 34 may be uniform, so that sensor elements 22 produce a monochromatic image in the visible or near-IR range, or filters 34 may be omitted entirely. Typically, to improve optical performance, an array of microlenses 32 is deposited over sensor elements 22.

A second, IR-sensing die 28 is bonded to the back side of die 26 and comprises an array of sensor elements 24, which output electrical signals in response to incident optical radiation in a band of wavelengths greater than 1000 nm. These wavelengths are transmitted through die 26, as explained above. Sensor elements 24 comprise a photosensitive material, which is sandwiched between a common electrode 38 and respective pixel electrodes 40. As noted earlier, the photosensitive material may comprise any suitable material with high quantum efficiency in the band of interest beyond 1000 nm, such as organic photodiodes, a quantum film, or a semiconductor material. The semiconductor material may be crystalline, polycrystalline, amorphous, or nano-crystalline in a suitable suspension. In the embodiment shown in FIG. 1B, die 28 also comprises an integral optical filter layer 36. Filtering arrangements for sensor elements 24 are described further hereinbelow.

The semiconductor material used in sensor elements 24 may comprise a III-V compound, such as GaAs, InP, InAs, InGaAs, InGaAsP, or InGaNAs(Sb), for example. Compounds containing InGaN, such as InGaNAs, are advantageous in that they can be mass-produced readily on GaAs substrates. Alternatively, the semiconductor material may comprise a II-VI compound, such as CdTe, HgTe, or HgCdTe, or an elemental semiconductor, such as germanium.

Further alternatively, the semiconductor material used in sensor elements 24 may comprise a compound of Group IV elements, such as SiGe or SiGeC.

In the present embodiment, the array of sensor elements 24 has a larger pitch than the array of sensor elements 22. (The term "pitch" is used in the present description and in the claims to refer to the center-to-center distance between adjacent sensor elements.) In the example shown in FIG. 1A, the pitch of sensor elements 24 is four times the pitch of sensor elements 22. For instance, the pitch of sensor elements may be 1.2 μm, taking advantage of the fine design rules available in silicon CMOS technology, while the pitch of sensor elements is 4.8 μm, giving enhanced sensitivity and signal/noise ratio in the IR sensing band. Alternatively, larger or smaller pitch ratios may be used, or the two arrays may have the same pitch.

A readout die 30 is bonded to the side of IR-sensing die 28 that is opposite silicon die 26. In the embodiment shown in FIG. 1B, readout die 30 includes readout circuits 54 and 56 for the sensor elements on dies 26 and 28, respectively. These readout circuits typically include switching logic for serially reading out the rows and columns of sensor elements 22 and of sensor elements 24, as well as amplification and sensing circuits. In addition, the readout circuits may comprise analog and/or digital components for image signal processing. Typically, readout die 30 is made from a silicon wafer, and the readout circuits are implemented in CMOS logic, as is known in the art. Alternatively, other implementations may be used.

To connect readout die 30 to IR-sensing die 28, metal lines 46 and 48 (with intervening dielectric layers) are deposited on respective surfaces of dies 28 and 30 in a back-end-of-line (BEOL) process, and the outer metal layers on these two dies are bonded together, for example by hybrid bonding. (Alternatively, other techniques of copper and oxide bonding may be used.) In the pictured example, each sensor element 24 in die 28 is connected by a respective hybrid bond 50 to a corresponding pixel circuit in readout circuit 56. Sensor elements 22 in die 26 are connected by conductive vias 44 extending through die 28 to metal lines 46, which typically connect respective columns or rows of sensor elements 22 to readout circuit 54 in die 30. In the example shown in FIG. 1C, conductive vias 44 extend through die 30 around the peripheries of sensor elements 24, while a central contact 52 connects each sensor element 24 to the corresponding pixel circuit in die 30.

Alternatively, other layouts of sensor elements 24 and vias 44 may be used. For example, vias 44 may pass through other areas of sensor elements 24. As another example, sensor elements 24 may have smaller areas than those shown in FIG. 1A, and central contacts 52 of multiple adjacent sensor elements 24 (for instance, groups of four adjacent sensor elements) may be connected together to give a larger effective sensing area. As yet another example, the vias may pass through die 28 outside the area of the array of sensor elements 24, with connections between the vias and sensor elements 22 through one or more metal layers between dies 26 and 28.

Further alternatively or additionally, other arrangements of readout circuits 54 and 56 may be used. For example, readout circuit 54 for sensor elements 22 may be implemented in die 26, typically on one or more sides of the die that are outside the area of the sensing array. In this case, readout die 30 may contain only readout circuit 56, for sensor elements 24. As a further alternative, readout circuit 56 may be implemented in die 28, in which case readout die 30 may not be needed at all. As yet another alternative, one or more silicon readout dies may be sandwiched between dies 26 and 28. In this case, the area of the readout die overlying the array of sensor elements 24 in die 28 is typically blank, without circuit elements that could interfere with the IR radiation passing through to die 28, while the readout circuits are located on one or more sides of the readout die.

Figure 2:
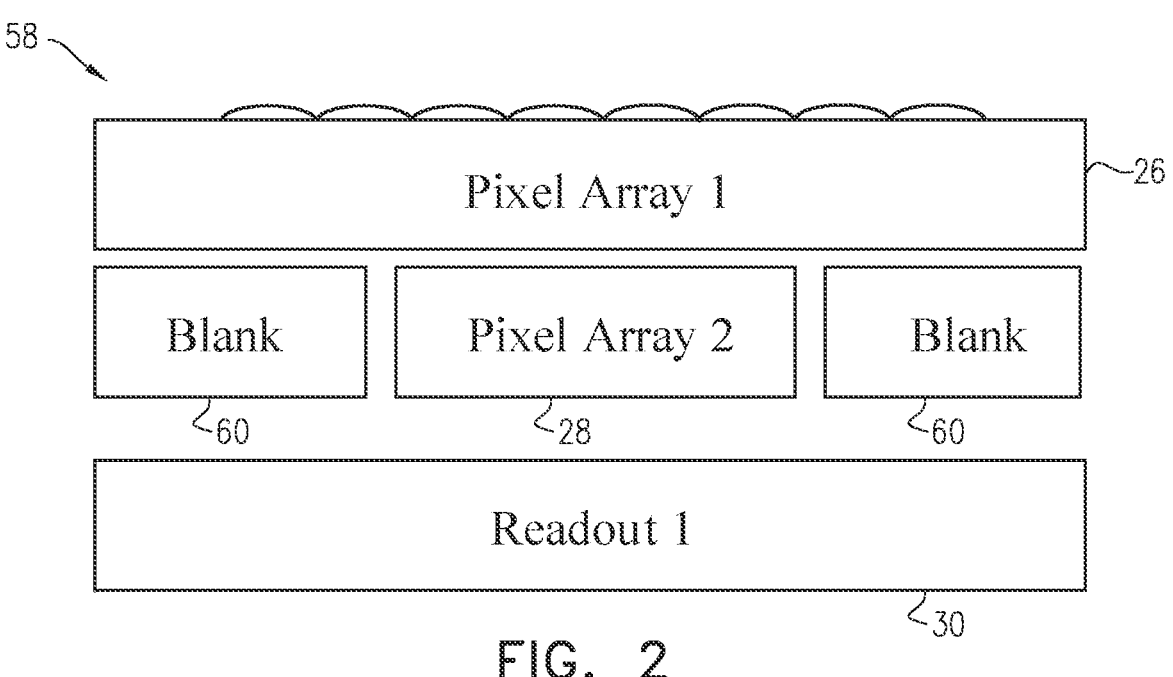
FIG. 2 is a schematic sectional view of a multispectral image sensor, in accordance with another embodiment of the invention.

FIG. 2 is a schematic sectional view of a multispectral image sensor 58, in accordance with another embodiment of the invention. Image sensor 58 is similar in functionality and design to image sensor 20 (FIGS. 1A-C), and similar elements are marked with the same indicator numbers in FIG. 2. In image sensor 58, however, die 28, and thus the array of sensor elements 24, extends over a smaller area than die 26. This difference in size can be the result optical, electrical, or structural constraints, for example. In this case, the gaps around die 28 are filled by blank dies 60. Alternatively, these gaps may be filled with another semiconductor or dielectric material, which is inserted using methods of physical or chemical deposition, for example.

Figure 3:
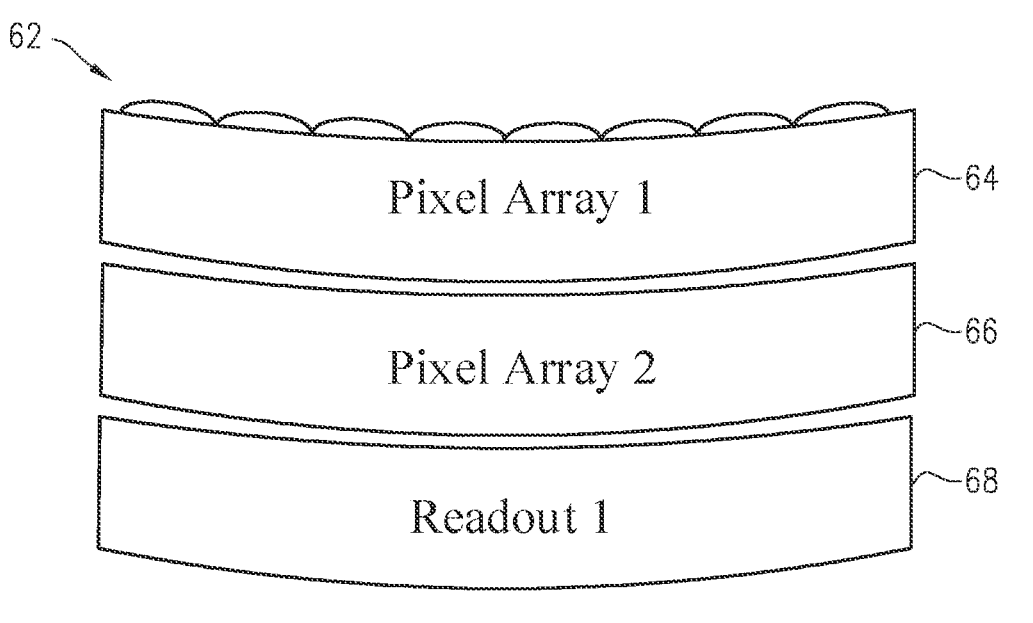
FIG. 3 is a schematic sectional view of a multispectral image sensor, in accordance with an alternative embodiment of the invention.

FIG. 3 is a schematic sectional view of a multispectral image sensor 62, in accordance with an alternative embodiment of the invention. As in the preceding embodiments, image sensor 62 comprises a silicon die 64, which is bonded to an IR-sensing die 66, which may be bonded to a readout die 68. In this embodiment, however, the dies are curved, with a common direction of curvature. The curvature is helpful in improving the optical performance of an imaging device incorporating image sensor 62. The optics in such a device are required to accommodate a broad spectral range, from visible through infrared; and the curvature of image sensor 62 allows for curvature of the focal plane of the optics, so that the designer can concentrate on reducing other aberrations across the spectral range.

Dies 64, 66, and 68 can be curved after the dies have been bonded together, or alternatively, the dies may first be curved individually and then bonded together. As one example, readout die 68 may be fabricated, thinned, and then bonded to a curved carrier or other package. Dies 64 and 66 are each fabricated, thinned, and curved, after which all the (curved) layers of image sensor 62 are bonded together.

Figure 4A:
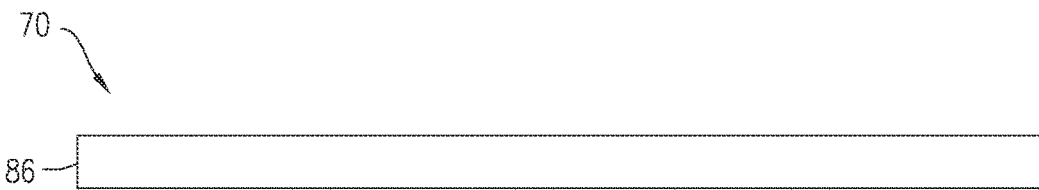
FIG. 4A is a schematic sectional view of a multispectral image sensor with two spectral filters, in accordance with an embodiment of the invention.
Figure 4A:
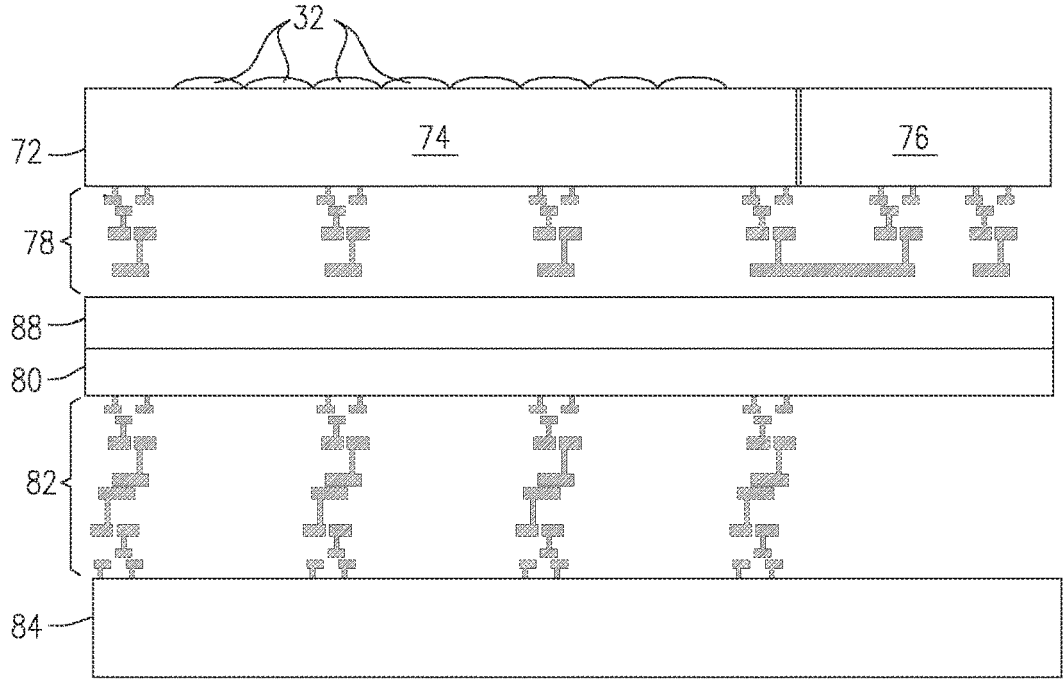

FIG. 4A is a schematic sectional view of a multispectral image sensor 70 with two spectral filters 86 and 88, in accordance with an embodiment of the invention. This embodiment addresses the need to limit the optical radiation that is absorbed by the silicon and infrared sensor elements to the specific sensing bands of interest, and particularly in avoiding interference due to solar background radiation and other radiation in the gap between the two bands.

In the pictured embodiment, image sensor 70 comprises a silicon die 72, which includes an array 74 of sensor elements and a readout circuit 76 alongside the array. Metal traces 78, interleaved with dielectric layers, connect the sensors in array 74 to readout circuit 76. As in the preceding embodiments, an intermediate die 80 comprises an array of IR sensor elements, which are connected by metal traces 82 to a readout circuit 84. An external optical filter 86 is mounted over the front side of silicon die 72, for example as a part of the imaging optics. An intermediate optical filter 88 is contained between silicon die 72 and IR intermediate die 80. Filter 88 may be deposited on die 80, like filter layer 36 (FIG. 1B), for example. Alternatively, filter 88 may be on a separate optical component, bonded between dies 72 and 80. Other possible implementations of intermediate optical filters are described hereinbelow with reference to FIGS. 5 and 6.

Figure 4B:
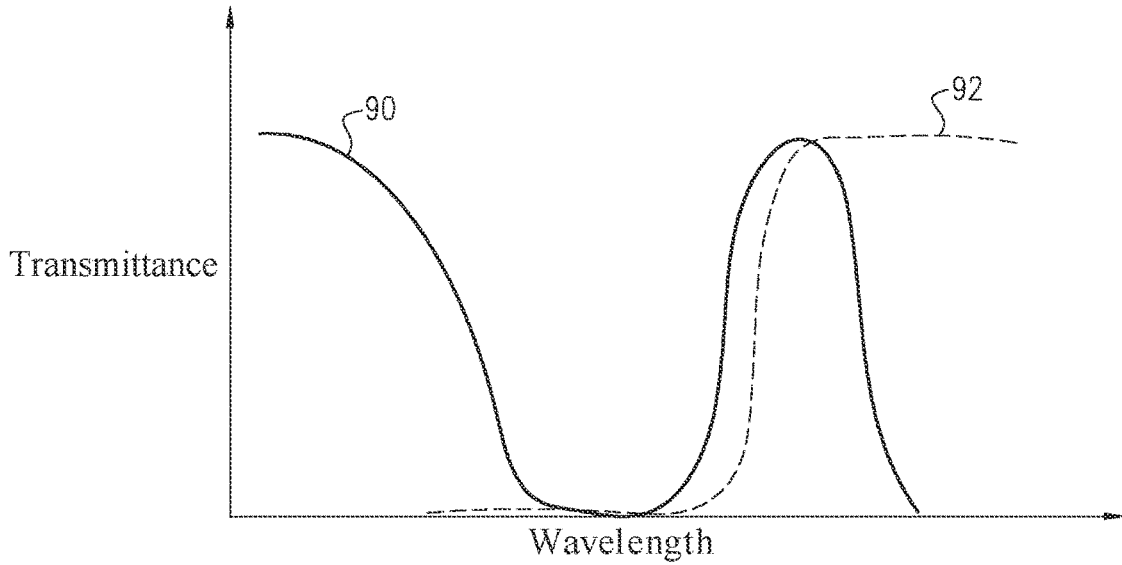
FIG. 4B is a schematic plot of the passbands of the spectral filters in the multispectral image sensor of FIG. 4A, in accordance with an embodiment of the invention.

FIG. 4B is a schematic plot of the optical transmittance of filters 86 and 88 in image sensor 70 as a function of wavelength, in accordance with an embodiment of the invention. The scales of the plot are in arbitrary units. A curve 90 represents the optical response of filter 86, while a curve 92 represents the optical response of filter 88. As shown by curve 90, filter 86 passes both the short-wavelength band of the silicon sensor array in die 72 and the long-wavelength band of the IR sensor array in die 80. As shown by curve 92, filter 88 passes only the long-wavelength band. Specifically, filter 86 may comprise an optical interference filter, having a first passband in the short-wavelength band and a second passband in the long-wavelength band. Filter 88 comprises an optical long-pass filter having a cut-on wavelength between the short- and long-wavelength bands. Filter 88 is useful, for example, in reducing the intensity of solar background radiation that is incident on die 80.

Filter 88 in image sensor 70 may comprise an interference filter and/or an absorption filter. Alternatively, depending on the range of wavelengths to which the IR sensor array on die 80 is sensitive, filter 88 may comprise a bandpass filter or even a short-pass filter.

Figure 5:
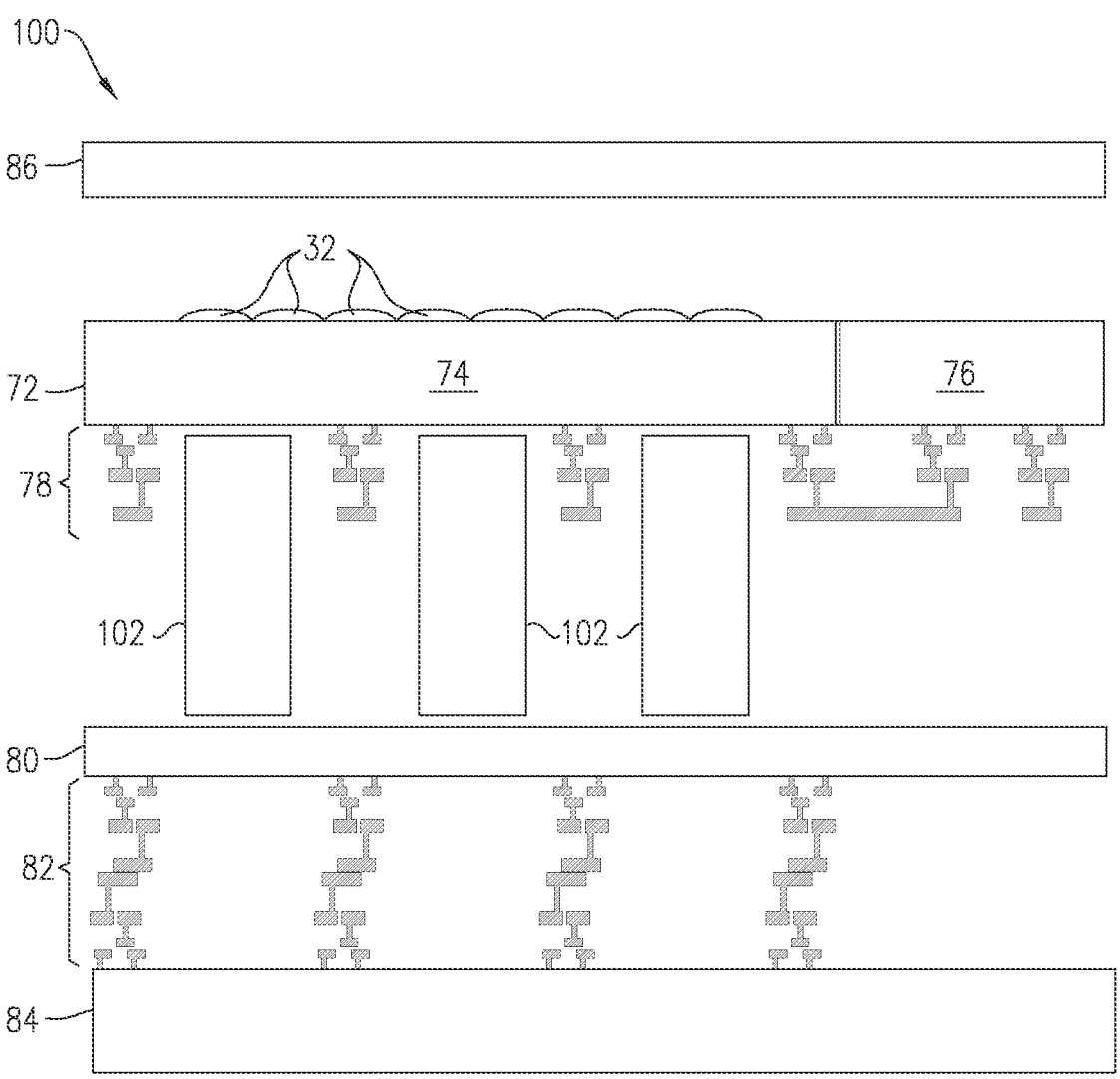
FIG. 5 is a schematic sectional view of a multispectral image sensor, in accordance with a further embodiment of the invention.

FIG. 5 is a schematic sectional view of a multispectral image sensor 100, in accordance with a further embodiment of the invention. Image sensor 100 is similar in design and operation to image sensor 70 (FIG. 4A), and the components of image sensor 100 are marked with the same indicator numbers as in image sensor 70. In place of filter 88, however, image sensor 100 comprises an array of waveguides 102, which are aligned with the sensor elements in die 80. Waveguides 102 comprise an IR-transmissive material and are arranged to facilitate transmission of IR radiation to the sensor elements in die 80, while reducing crosstalk and filtering out radiation outside the spectral band of interest.

Figure 6:
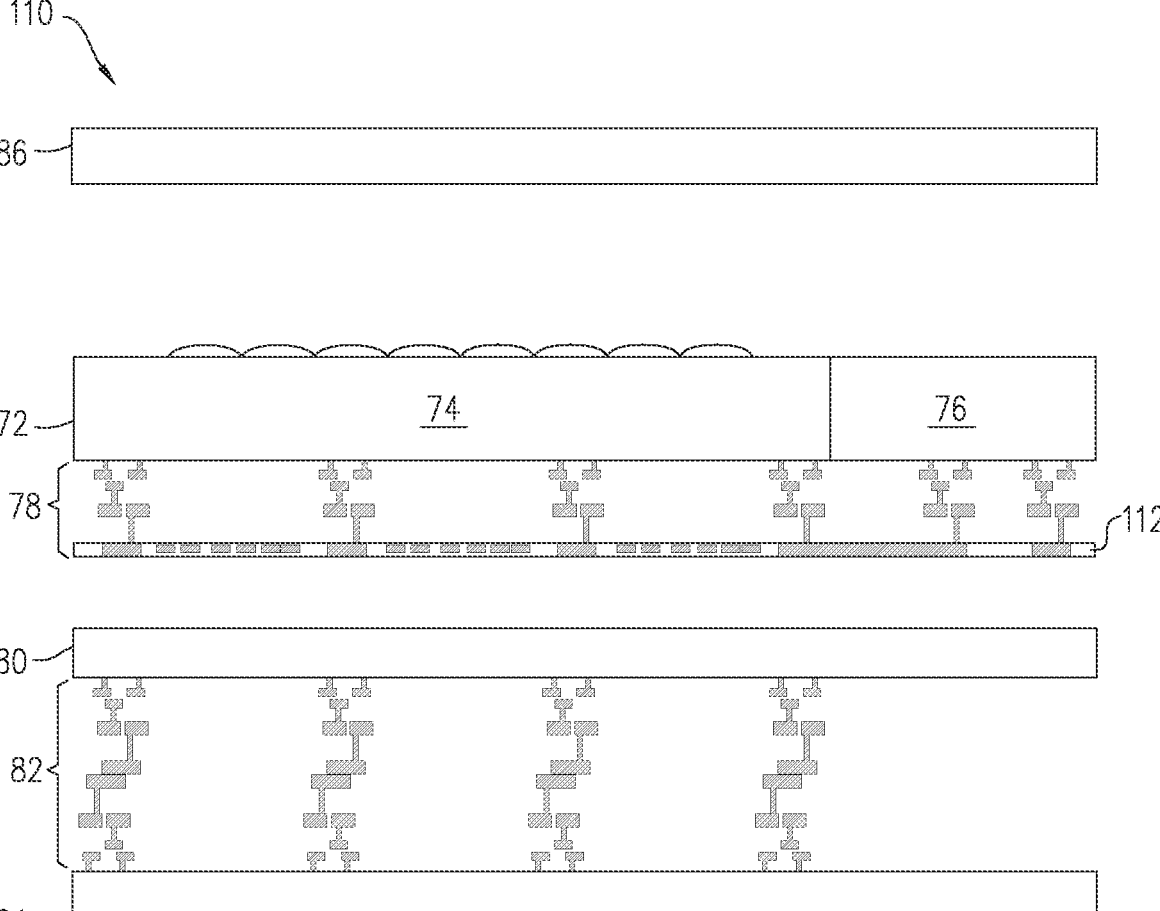
FIG. 6 is a schematic sectional view of a multispectral image sensor with two spectral filters, in accordance with yet another embodiment of the invention; an FIGS. 7A, 7B, 7C, 7D, and 7E are schematic sectional views showing successive stages in fabrication of a multispectral image sensor, in accordance with an embodiment of the invention.

FIG. 6 is a schematic sectional view of a multispectral image sensor 110 with two spectral filters 86 and 112, in accordance with yet another embodiment of the invention. Image sensor 110 is likewise similar to those shown in FIGS. 4A and 5, but intermediate optical filter 112 is implemented as a part of the metal layers on the back side of silicon die 72. Some of these metal layers are used in forming metal traces 78, which connect the sensors in array 74 to readout circuit 76. One or more of the remaining metal layers serve as a part of optical filter 112. For example, the thicknesses of these metal layers and the intervening dielectric layers may be chosen so that the layers together operate as an optical interference filter.

Alternatively, one or more of the metal layers may be patterned to define a diffraction grating, with a period chosen so as to guide optical radiation in the desired wavelength band toward the sensor elements in die 80, while reflecting or deflecting other wavelengths away from the sensor elements. This diffraction grating may be positioned in an intermediate location between dies 72 and 80, as illustrated by filter 112 in FIG. 6. Alternatively, the diffraction grating may be formed directly on the back side of die 72.

Although the intermediate optical filters in FIGS. 4A and 6 are shown as uniform filter layers, in an alternative embodiment (not shown in the figures), the intermediate filter layer may be patterned, so that different sensor elements or groups of sensor elements in die 80 receive optical radiation in different wavelength bands.

FIGS. 7A, 7B, 7C, 7D, and 7E are schematic sectional views showing successive stages in the fabrication of multispectral image sensor 20 (FIG. 1), in accordance with an embodiment of the invention.

Figures 7A, 7B, 7C:
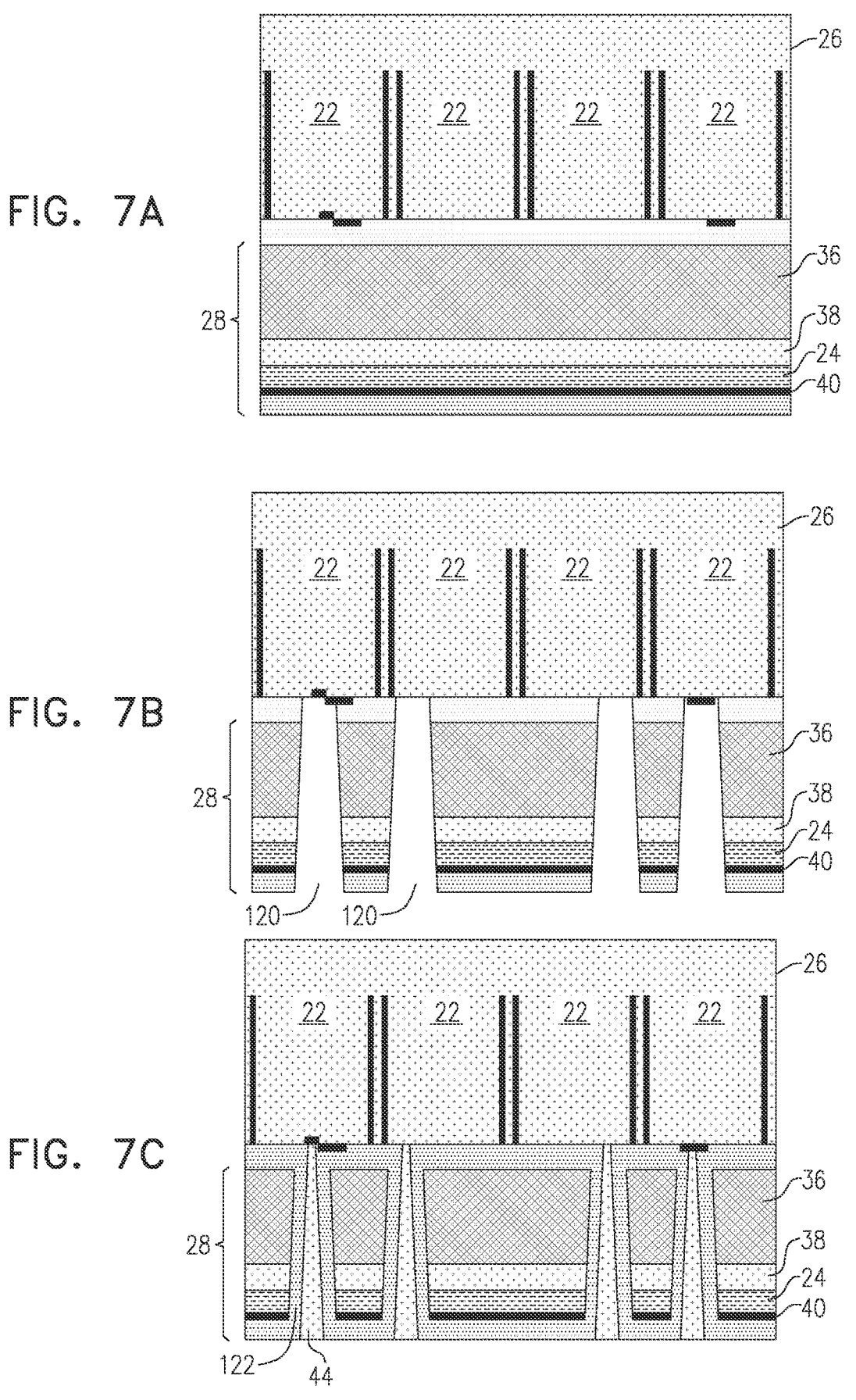

Initially, as shown in FIG. 7A, sensor elements 22 are formed in die 26. Filter 36, electrode 38, and sensor elements 24 are deposited as epitaxial layers on die 28, which is then bonded to die 26 and planarized, using a chip-on-wafer (CoW) process, for example. Electrodes 40 are deposited and patterned over sensor elements 24. Next, as shown in FIG. 7B, trenches 120 are opened through dies 28 to sensor elements 22, for example by a process of photolithography and etching. As shown in FIG. 7C, these trenches are filled with a dielectric material 122, such as $SiO_2$, which is then etched and filled with a metal, such as copper, to form vias 44. Central contact 52 (FIG. 1C) can also be etched and formed at this stage to contact electrode 40 of each sensor element 24.

Figure 7D:
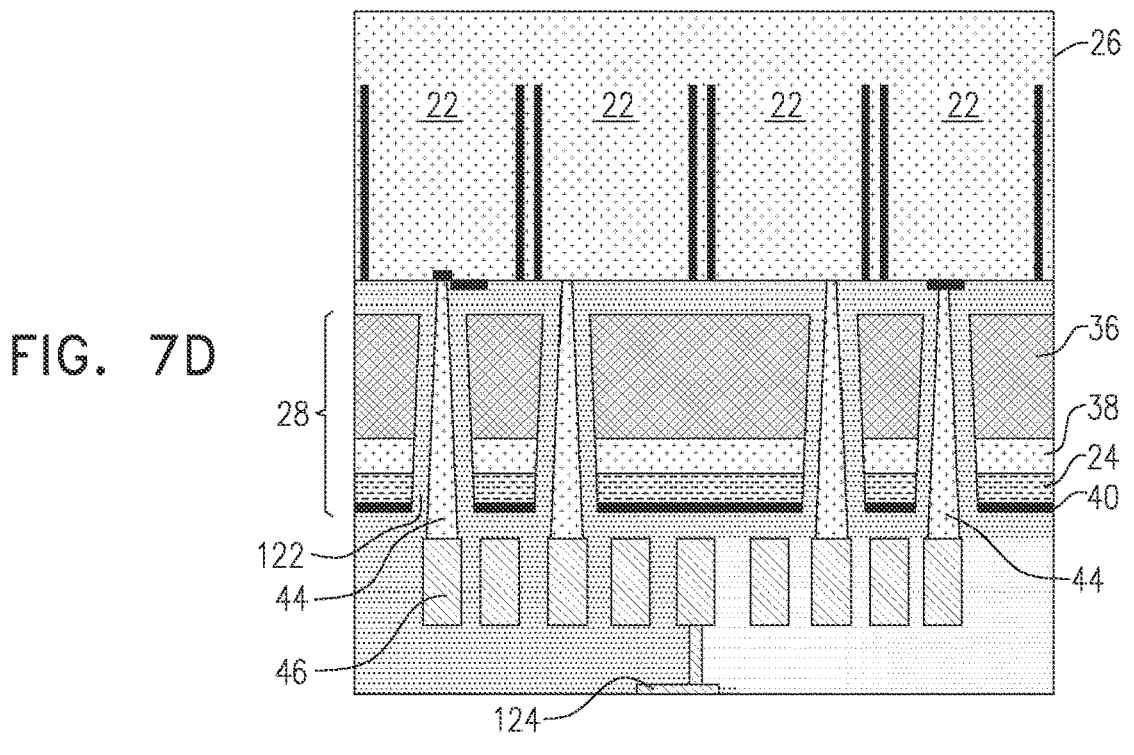
Figure 7E:
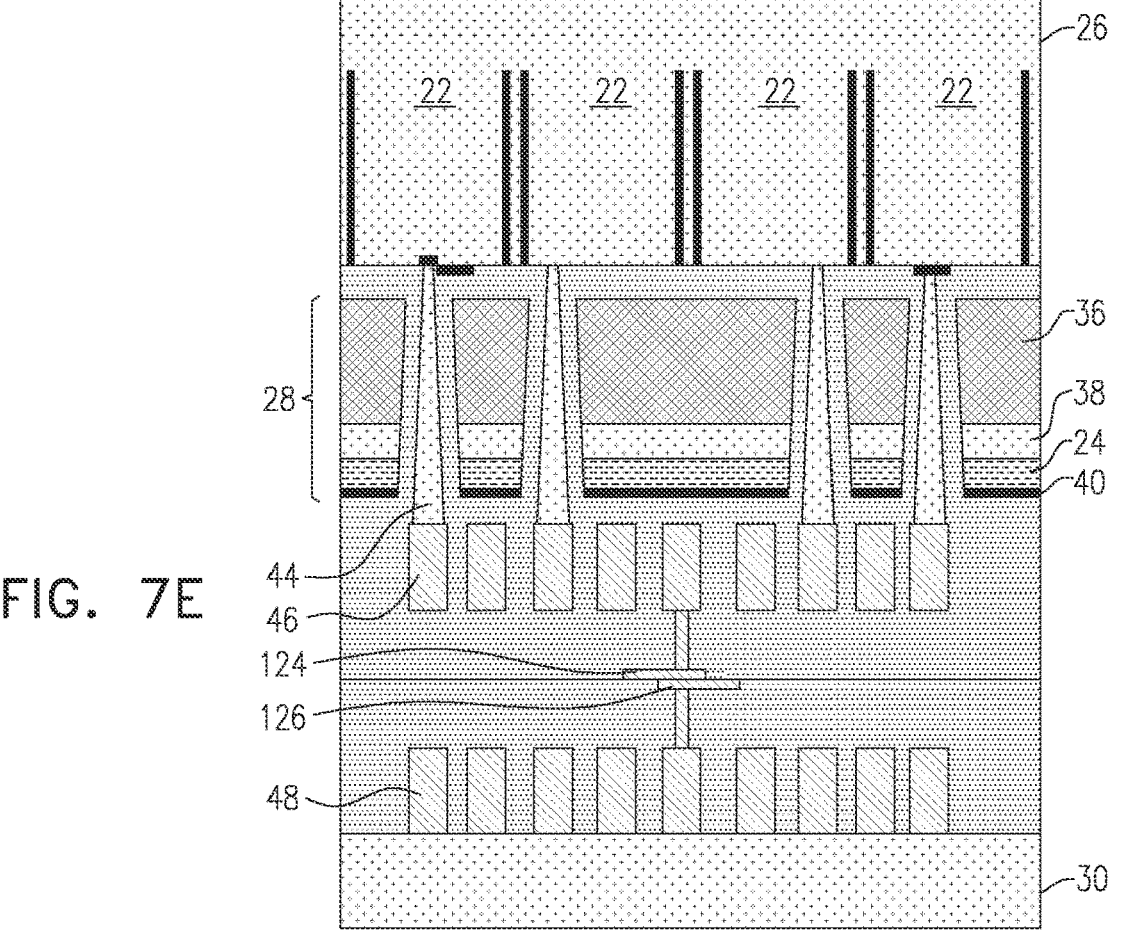

Metal lines 46 are deposited and patterned on the side of die 28 opposite die 26, in a back-end-of-line (BEOL) process, as shown in FIG. 7D. These metal lines connect to vias 44 and also include hybrid bonding pads 124 connected to the central contacts of sensor elements 24. Metal lines 48 are similarly deposited and patterned on readout die 30, and include hybrid bonding pads 126, as shown in FIG. 7E. Dies 28 and 30 are aligned, and the bonding pads are connected together by hybrid bonding. Color filters 34 and microlenses 32 are added on the front side of dies 26 to complete the process, as shown in FIG. 1B.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A multispectral sensing device, comprising:

a first die, which has a front side and a back side and comprises silicon, which is patterned to define a first array of first sensor elements configured to output first electrical signals in response to optical radiation that is incident on the device in a first band of wavelengths less than 1000 nm that is incident on the front side of the first die;

a second die, which has a first side bonded to the back side of the first die and comprises a photosensitive material, and which is patterned to define a second array of second sensor elements configured to output second electrical signals in response to the optical radiation that is incident on the device in a second band of wavelengths greater than 1000 nm that passes through the first die and is incident on the first side of the second die;

readout circuitry coupled to read the first electrical signals and the second electrical signals serially out of the device;

a first optical filter disposed over the front side of the first die and configured to pass both the first and second bands of wavelengths;

a second optical filter disposed between the first and second dies and configured to pass the second band of wavelengths; and multiple metal layers disposed on the back side of the first die, including at least a first metal layer that is patterned to connect the first sensor elements to the readout circuitry and a second metal layer that is configured to serve as a part of the second optical filter, wherein the second metal layer is patterned to define a diffraction grating with a period chosen so as to guide the optical radiation in the second band of wavelengths toward the second sensor elements, while reflecting or deflecting other wavelengths away from the sensor elements.

2. The device according to claim 1, and comprising a third die, which is bonded to a second side of the second die, opposite the first side, and which comprises at least a part of the readout circuitry.

3. The device according to claim 2, and comprising conductive vias extending through the second die so as to connect the first sensor elements to the readout circuitry in the third die.

4. The device according to claim 3, wherein the conductive vias extend through the second die around respective peripheries of the second sensor elements.

5. The device according to claim 1, wherein the photosensitive material in the second die comprises a semiconductor material.

6. The device according to claim 5, wherein the semiconductor material comprises InGaAsN.

7. The device according to claim 5, wherein the semiconductor material comprises SiGeC.

8. The device according to claim 1, wherein the first die is patterned with an array of color filters.

9. The device according to claim 1, wherein the photosensitive material in the second die comprises a quantum film.

10. The device according to claim 1, wherein the second sensor elements in the second die comprise organic photodiodes.

11. The device according to claim 1, wherein the first array has a first pitch, and wherein the second array has a second pitch, which is greater than the first pitch.

12. The device according to claim 1, wherein the first array extends over a first area of the first die, and wherein the second array extends over a second area of the second die, which is smaller than the first area.

13. The device according to claim 1, wherein the first optical filter has a first passband in the first band of wavelengths and a second passband in the second band of wavelengths, and wherein the second optical filter comprises an optical long-pass filter having a cut-on wavelength between the first and second bands.

14. The device according to claim 1, wherein the second optical filter comprises an arrangement of waveguides, which are aligned with the second sensor elements.

15. A method for producing a sensing device, comprising:

patterning a first die, which has a front side and a back side and comprises silicon, to define a first array of first sensor elements configured to output first electrical signals in response to optical radiation that is incident on the device in a first band of wavelengths less than 1000 nm that is incident on the front side of the first die;

bonding a first side of a second die, which comprises a photosensitive material, to the back side of the first die;

patterning the second die to define a second array of second sensor elements configured to output second electrical signals in response to the optical radiation that is incident on the device in a second band of wavelengths greater than 1000 nm that passes through the first die and is incident on the first side of the second die;

coupling readout circuitry to read the first electrical signals and the second electrical signals serially out of the device;

disposing a first optical filter over the front side of the first die and configured to pass both the first and second bands of wavelengths;

disposing a second optical filter between the first and second dies and configured to pass the second band of wavelengths; and disposing multiple metal layers on the back side of the first die, including at least a first metal layer that is patterned to connect the first sensor elements to the readout circuitry and a second metal layer that is configured to serve as a part of the second optical filter, wherein the second metal layer is patterned to define a diffraction grating with a period chosen so as to guide the optical radiation in the second band of wavelengths toward the second sensor elements, while reflecting or deflecting other wavelengths away from the sensor elements.

16. The method according to claim 15, and comprising bonding a third die to a second side of the second die, opposite the first side, wherein the third die comprises at least a part of the readout circuitry.

* * * * *